(12) United States Patent
King

(10) Patent No.: US 10,431,292 B2
(45) Date of Patent: Oct. 1, 2019

(54) METHOD AND APPARATUS FOR CONTROLLING ACCESS TO A COMMON BUS BY MULTIPLE COMPONENTS

(71) Applicant: MICRON TECHNOLOGY, INC., Boise, ID (US)

(72) Inventor: Gregory A. King, Hastings, MN (US)

(73) Assignee: Micron Technology, Inc., Boise, ID (US)

( * ) Notice: Subject to any disclaimer, the term of this patent is extended or adjusted under 35 U.S.C. 154(b) by 267 days.

(21) Appl. No.: 15/589,871

(22) Filed: May 8, 2017

(65) Prior Publication Data

US 2017/0243631 A1    Aug. 24, 2017

Related U.S. Application Data

(63) Continuation of application No. 14/299,441, filed on Jun. 9, 2014, now Pat. No. 9,684,622.

(51) Int. Cl.
| | |
|---|---|
| H04L 12/40 | (2006.01) |
| G11C 11/4076 | (2006.01) |
| G06F 13/42 | (2006.01) |
| G06F 13/36 | (2006.01) |
| G06F 13/16 | (2006.01) |
| G06F 13/376 | (2006.01) |
| G11C 8/18 | (2006.01) |
| G06F 12/02 | (2006.01) |
| G11C 5/00 | (2006.01) |

(52) U.S. Cl.
CPC ...... *G11C 11/4076* (2013.01); *G06F 13/1626* (2013.01); *G06F 13/1689* (2013.01); *G06F 13/36* (2013.01); *G06F 13/376* (2013.01); *G06F 13/4217* (2013.01); *G06F 13/4221* (2013.01); *G11C 8/18* (2013.01); *G06F 12/02* (2013.01); *G11C 5/00* (2013.01); *Y02D 10/14* (2018.01); *Y02D 10/151* (2018.01)

(58) Field of Classification Search
CPC ...... G06F 13/1689; G06F 13/36; Y02D 10/14
See application file for complete search history.

(56) References Cited

U.S. PATENT DOCUMENTS

| | | | |
|---|---|---|---|
| 5,469,547 A | 11/1995 | Pawlowski | |
| 6,611,905 B1 | 8/2003 | Grundon et al. | |
| 7,016,240 B1 | 3/2006 | Avakian et al. | |
| 7,117,382 B2 * | 10/2006 | Khieu | G06F 5/06 |
| | | | 713/401 |
| 9,432,298 B1 * | 8/2016 | Smith | H04L 49/9057 |
| 9,684,622 B2 | 6/2017 | King et al. | |

(Continued)

*Primary Examiner* — Farley Abad
(74) *Attorney, Agent, or Firm* — Dorsey & Whitney LLP

(57) ABSTRACT

Apparatuses and methods for controlling access to a common bus including a plurality of memory devices coupled to a common bus, wherein individual ones of the plurality of memory devices are configured to access the common bus responsive to a strobe signal, and a strobe line driver programmed with a first delay associated with a combination of a first command type and a first one of the plurality of memory devices to provide a first strobe signal to the first one of the plurality of memory devices, and further programmed with a second delay associated with a combination of a second command type and a second one of the plurality of memory devices to provide a second strobe signal to the second one of the plurality of memory devices.

18 Claims, 5 Drawing Sheets

(56) References Cited

U.S. PATENT DOCUMENTS

| | | | |
|---|---|---|---|
| 2004/0022095 A1* | 2/2004 | Lee | G11C 7/10 |
| | | | 365/200 |
| 2004/0068633 A1* | 4/2004 | Engelahardt | G11C 7/1075 |
| | | | 711/167 |
| 2006/0004955 A1 | 1/2006 | Ware et al. | |
| 2010/0091537 A1 | 4/2010 | Best et al. | |
| 2011/0208906 A1 | 8/2011 | Gillingham | |
| 2012/0239874 A1 | 9/2012 | Lee et al. | |
| 2012/0290800 A1 | 11/2012 | Krishnan et al. | |
| 2015/0356048 A1 | 12/2015 | King | |

* cited by examiner

METHOD AND APPARATUS FOR CONTROLLING ACCESS TO A COMMON BUS BY MULTIPLE COMPONENTS

CROSS REFERENCE TO RELATED APPLICATION(S)

This application is a continuation of U.S. patent application Ser. No. 14/299,441 filed Jun. 9, 2014 and issued as U.S. Pat. No. 9,684,622 on Jun. 20, 2017. The aforementioned application, and issued patent is incorporated herein by reference in its entirety for any purpose.

BACKGROUND

Memories may be included in a variety of devices, such as computers, portable electronic systems, smartphones, etc. As the devices that use memories continue to decrease in size while providing greater performance, the memory or memories included within are desired to provide ever larger storage capacities at ever decreasing sizes. To this end, memory devices may incorporate multiple memory die (e.g., memory chips) into a single board-mountable package.

These multi-die packages may conventionally include a controller to control the multiple memory die that may be connected to a common bus. The common bus may be a combination data and command bus or there may be a shared data bus and a shared command bus. Whatever connection scheme is used, the controller may control the access of the common bus (or busses) by the multiple memory die to avoid collisions on the common bus that may occur during consecutive operations. The controller may avoid such collisions by controlling the timing of the access of the common bus by the various memory die in the multi-die package.

To control the timing and access of the common bus by the various memory die in the package, the controller may include circuitry for generating and sending strobe signals, for example, to each die on dedicated strobe lines. For example, if the memory device receives a read command intended for a specific memory die in the package, the controller may generate a strobe signal and transmit that strobe signal to the intended memory die when the read command is provided on the common bus so that the intended memory die can capture the read command. The other memory die in the package may not access the common bus because the controller does not provide the other memory die with a strobe signal during the time the intended memory die is accessing the common bus. The number of strobe lines per die may depend on the number of various commands and/or inputs each die may receive. For example, there may be a strobe line for read commands and a strobe line for write commands. Other strobe lines may also be included for each die, for example, the other strobe lines used for refresh commands and modify commands.

The controller may include strobe signal circuitry for providing the strobe signals, which may include separate dedicated signal driver circuits for each strobe signal. These dedicated strobe signal circuits may all be substantially similar and include circuit stages such as clock trees, delay elements, signal drivers, and etc. As the number of die in the package increases and the number of strobe lines increase, the more controller die area will be used for the strobe signal circuitry. As a result, a large area of the die may be consumed by the strobe signal circuitry, which may also increase power consumption. As such, apparatuses and methods that may reduce the amount of strobe signal circuitry included in a controller may be desired so that the controller die size may be reduced despite including multiple memory die in the single board-mountable package.

DETAILED DESCRIPTION

Figure 1:
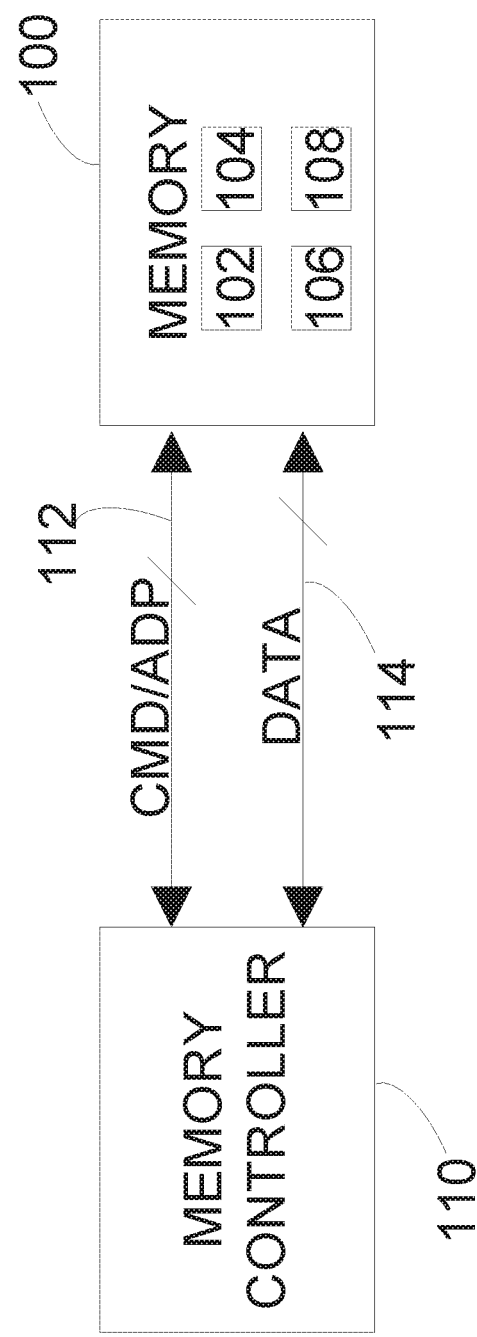
FIG. 1 is a block diagram of an example apparatus according to the present disclosure.

Certain details are set forth below to provide a sufficient understanding of examples of the invention. However, it will be clear to one having skill in the art that examples of the invention may be practiced without these particular details. Moreover, the particular examples of the present invention described herein should not be construed to limit the scope of the invention to these particular examples, In other instances, well-known circuits, control signals, timing protocols, and software operations have not been shown in detail in order to avoid unnecessarily obscuring the invention, Additionally, terms such as "couples" and "coupled" mean that two components may be directly or indirectly electrically coupled. Indirectly coupled may imply that two components are coupled through one or more intermediate components.

Conventionally, memory devices that include multiple memory die, for example, DRAM, NAND Flash, ROM, etc., may include control logic and/or interface logic to control the commands performed by the multiple memory die and the flow of the associated data. In such an example, the multiple memory die may be packed along with the control logic in a single package. For example, a control logic chip and multiple memory die may be configured in a physical stack and connected to one another by through-vias (holes in the various die that have conductive paths through them interconnecting the various die). The stacked configuration of the previous example is not limiting and the disclosure herein applies to other connection configurations as well. Additionally, the control logic and the various memory die may be all coupled to a common bus, which may be a data bus, a command bus, or a combination data and command bus. Because the multiple memory die are connected to the common bus, the control logic, as noted, may control the flow of data and commands into the memory device and to a final destination or memory die. The controller may also control data flowing out of the device intended for external components. The control logic may further be coupled to each of the memory die through respective dedicated strobe lines and may include circuitry to provide respective strobe signals to each memory die.

This control, at least partially, may require the control logic to analyze a received command to determine for which memory die it is intended, and then to control the intended memory die to access the common bus so that the data and/or command is captured by the intended memory die at the appropriate time. To activate the intended memory die, the control logic may provide an active strobe signal to the memory die at a time when the data/command is on the bus or when the data should be put on the bus (this directional aspect may be command dependent, e.g., reads, writes, refreshes, and etc.). The active strobe signal may cause the intended memory die to capture information on the common bus or drive information onto the common bus. For example, the active strobe signal may cause an output or input pad of the intended memory die that is connected to the common bus to activate.

Due to both the layout of a memory device including the multiple memory die and inherent differences between the operation of the multiple memory die, e.g., due to variations in processing, temperature, and voltages, their associated latency may be different. Each memory die may also have a different latency associated with the executing of different commands as well, e.g., a write latency may be different than a read latency. The latency of each memory die may be accounted for by the use of delays in providing the strobe signals. For example, if a memory die is processing a read command, the control logic may delay transmitting the strobe signal for providing the data to the common bus due to the time the memory die takes to process the read command and ready the data in relation to an expected time to provide the data to the common bus. To account for these differences in latency, the control logic may use programmable delays to provide strobe signals to the various memory die. Depending on the number of memory die in the memory device, the amount of area on the control logic die consumed by strobe line driver circuits may be appreciable. To save area and power consumption, the control logic may include multiple strobe line driver circuits (instead of a dedicated driver circuit for each strobe line) that can be selectively connected to and shared by any of the dedicated strobe lines.

The control logic, based on a sequence of commands for example, may program a corresponding number of strobe line driver circuits, e.g., program their delay time with a delay time associated with the command and the destination memory die, and time when the strobe signals will be sent in relation to each other, e.g., activation of the memory die, and/or in relation to a common clock signal. And depending on the number of commands received to the number of strobe line driver circuits, the control logic may program any one of the strobe line driver circuits to provide multiple strobe signals to any of the intended memory die. The timing of the sequence of strobe signals may be set to avoid data collisions on the common bus, e.g., data being provided to the common bus while the common bus holds other data, and to ensure the common bus is used to maximum efficiency by minimizing the amount of time the bus in not in use. Additionally, depending on the sequence of the commands, some active strobe signals may be sent while a previous strobe signal is still active. This overlapping of active strobe signals may be possible since the strobe lines are dedicated to a particular memory die (not shared by the memory die) and due to the latency associated with various commands. For example, two consecutive read commands received may allow the control logic to provide a subsequent read strobe signal two clock cycles before a prior active read strobe signal becomes inactive due to a read command requiring set up time. The overlap of the active read strobe signals may also ensure the common bus is efficiently utilized.

The memory device may be included in a larger electronics system, a smartphone or laptop computer for example, and may be used to store data, either temporarily or more permanently, used by the electronics system. In this configuration, the control logic may act as an interface controller of the multiple memory die by controlling the flow and timing of commands and data to and from the multiple memory die. In such capacity, the control logic may base the control on the timing of the common bus and the timing of the strobe signals to ensure maximum bus efficiency.

The interface control described herein is not limited to the control of memory devices and the examples given should not be taken as such. Other electronic systems may utilize the interface technique discussed herein. In systems that share a resource, a common communication pathway for example, in which timing of the use of the shared resource and efficiency may be central. For example, a microcontroller coupled with various components (input devices, output devices, storage devices, etc.) coupled by a common link may implement the interface control technique to control which component and when the common link is accessed to either capture information being transmitted on the link or provide information onto the link destined for another component.

FIG. 1 is a block diagram of an example apparatus 100 according to the present disclosure. The apparatus 100 may comprise circuitry, one or more semiconductor die, a packaged semiconductor, a device including such circuitry, die, or package, and/or a system including such a device. As used herein, apparatus may refer to, for example, an integrated circuit, a memory device, a memory system, an electronic device or system, and may be included in a smart phone, a tablet, a computer, a server, etc. The apparatus 100 includes an interface control circuit 102 and a plurality of memory die 104, 106, and 108. The interface control circuit 102 may be included in control logic (not shown) of the apparatus. To simplify the discussion only three memory die are shown but the present disclosure may work with any number of memory die and is not limited as such. The memory die 104, 106, and 108 may include any type of memory, such as dynamic random access memory (DRAM), synchronous DRAM, NAND Flash, non-volatile, and/or volatile memory. The type of memory die used in the apparatus 100 should not be construed as limiting to the present disclosure. A memory controller 110 and the apparatus 100 may be coupled by a command and address (CA) bus 112 and a data bus 114. The apparatus 100 may be configured to receive commands and/or addresses from the memory controller 110 over the CA bus 112, and the apparatus 100 may be configured to receive data and/or provide data over the data bus 114.

The apparatus 100 may be configured to perform memory operations (e.g., read operations, write operations, refresh operations, and etc.) in response to the received commands and/or addresses that are provided by the memory controller 110. For example, the apparatus 100 may provide read data to the memory controller 110 over the data bus 114 in response to a read command, and may store write data received over the data bus 114 in response to a write command. Additionally, the apparatus 100 may further provide information to the memory controller 110 over the data bus 114 in response to particular commands. The information may indicate, for instance, whether the apparatus 100 is available to perform a memory operation and/or an amount of time before the apparatus 100 may become available to perform a memory operation.

The apparatus 100, as noted, may include an interface control circuit 102 and a plurality of memory die 104, 106, and 108. The interface control circuit may control access to the common bus by the plurality of memory die and may be further configured to activate the plurality of memory die in a timed and delayed sequence, wherein the activation of the plurality of memory die may cause the memory die to independently access the common bus for an activation period. The interface control circuit 102 may be configured to receive a command from the memory controller 110 and determine which of the plurality of die the command should be associated. Upon this determination, the interface controller 102 may provide an active strobe signal to the appropriate memory die to cause that memory die to access a common data and/or command bus (not shown) so that the intended memory die may capture the command and/or data present on the common bus. As noted above, the interface control circuit 102 may include unique circuitry to provide the active strobe signals to each of the plurality of memory die in the apparatus 100. Based on how memory die function, each unique strobe line may need to be delayed by a respective amount associated with providing data to or from that particular memory die, which may also be different based on the type of command being executed. As such, each respective strobe line may require a delay programmed for that particular command and for that particular memory die. For example, the apparatus 100 includes three memory die and, assuming two unique strobe lines per memory die (there could be more than two per memory die, however), the interface control circuit 102 may include six dedicated strobe line driver circuits. Six dedicated strobe line driver circuits may not consume excessive die area but the addition of more memory die to the apparatus 100, and consequently the addition of more dedicated strobe line driver circuits, may quickly consume more area of the interface control circuit 102 die along with increasing power consumption.

The size of the interface control circuit 102 die in terms of area may be eased by combining numerous strobe line driver circuitries into a fewer number of strobe line driver circuits that may be shared by multiple ones of the memory die of the apparatus 100. The respective strobe lines may be retained but the strobe line driver circuits may be reduced. For example, instead of six dedicated strobe line driver circuits, the interface control circuit 102 may only include two strobe line driver circuits, which may be programmable to provide active strobe signals over any of the six respective strobe lines. In some embodiments, the minimum number of strobe line driver circuits may be based on the number of memory die, the number of specific strobe signals for each memory die, and for common bus efficiency. The common bus efficiency may be defined as maximizing the amount of information on the common bus without causing collisions, information overlap, or time periods where the common bus is not transporting information. Thus, a relationship may exist to maximize bus efficiency based on the number of memory die and the number of dedicated strobe lines.

Figure 2A:
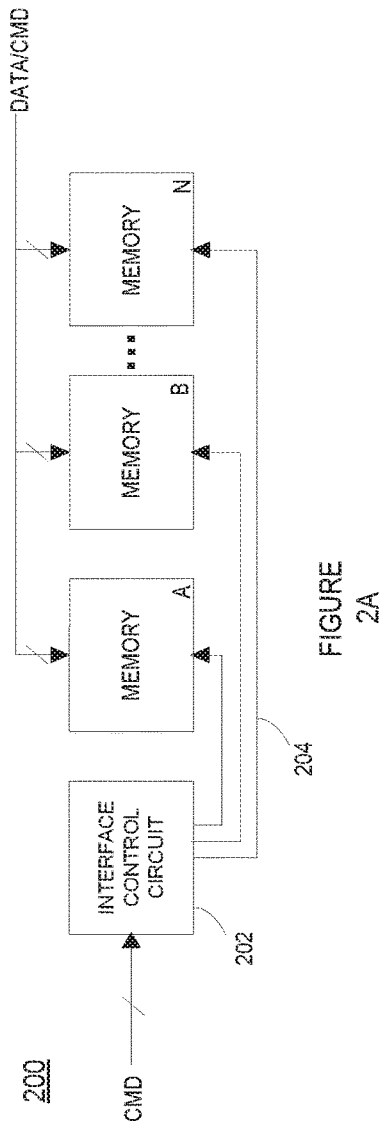
FIGS. 2A and 2B are block diagrams of example memory devices according to the present disclosure.
Figure 2B:
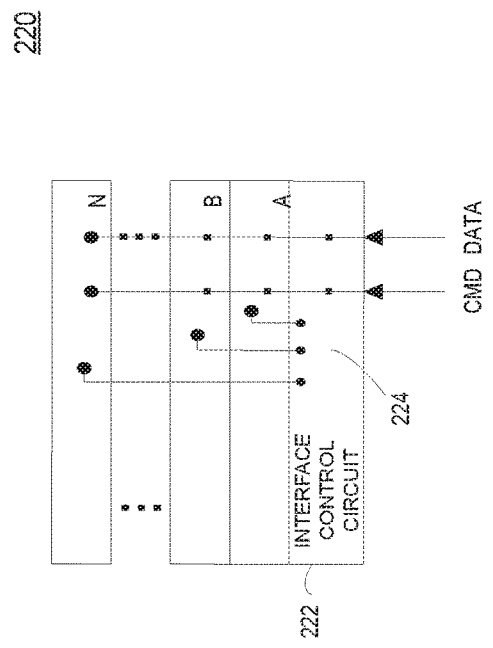

FIGS. 2A and 2B illustrate memory devices 200 and 220, respectively, according to an embodiment of the invention. The examples illustrated by FIGS. 2A and 2B may be used for the apparatus 100 of FIG. 1 and may include memory modules containing a plurality of memory die and implementing the interface control circuit 102.

Referring to FIG. 2A, the apparatus 200 may include an interface control circuit 202 and the plurality of memories A through N. The plurality of memories A-N may be memory die packaged with the interface control circuit 202 or may be included in a memory module with each component (control circuit and multiple memories) as standalone packaged device. The various components of the apparatus 200 may share a common data and/or command bus and the memories A-N may be coupled to the interface control circuit 202 by respective, dedicated strobe lines 204. The data/command bus is shown as one bus for simplicity but could be implemented as two separate busses—a common data bus and a common command bus. The interface control circuit 202 may receive a command from a memory controller, such as the memory controller 110 of FIG. 1, for example, and may provide an active strobe signal to one of the plurality of memories A-N to which the command is directed. For example, a read command for data stored on memory A may cause the interface control circuit 202 to provide an active strobe signal to memory A, which may cause memory A to access the common bus at the intended time, e.g., when the command is present on the common bus, to capture the command.

Referring to FIG. 2B, the apparatus 220 may be a stacked memory device where multiple memory die are physically stacked on one another with a logic controller, conventionally, being the first die in the stack. Thus, the logic controller and the multiple memory die may be stacked together and packaged in a single package. The entire stack of die may be connected by through-vias so that the logic controller may communicate with each die and so that each die may be coupled to a common bus. The apparatus 220 may include an interface control circuit 222, which may be included in a logic controller, and a plurality of memory die A-N. The interface control circuit 224 and the plurality of memory die A-N may be coupled to a common data bus and a common command bus (alternatively, the common data bus and the common command bus may be combined into a single common bus). Additionally, the interface controller may be further coupled to the individual memory die A-N by individual strobe lines 224, such that each memory die A-N has an associated and dedicated strobe line. As with the apparatus 200, the apparatus 220 may receive a command, a write command for example, and the interface controller 222 may determine which memory die A-N is to receive the command. The interface controller 222, through strobe driver circuits, may provide an active strobe signal to an intended memory die when the write data is on the common data bus so that the intended memory die captures the data from the common data bus.

Both the interface control circuit 202 and the interface control circuit 222 may implement a shared strobe interface circuit as described above. For example, the interface control circuit 222 may include four strobe line driver circuits to provide the dedicated strobe lines used to provide active strobe signals to the N memory die of apparatus 220. Thus, if there are two dedicated strobe lines per memory die A-N, then the interface control circuit 222 may include four strobe line driver circuits instead of 2N strobe line driver circuits to provide strobe signals to the 2N dedicated strobe lines. Thus, die area and power savings may be obtained by using a smaller number of strobe line driver circuits to provide the active strobe signals to all 2N strobe lines. Each of the strobe line driver circuits may be programmable in various aspects, delay times for example, and may be coupled to a strobe line for any of the memory die through a multiplexer. Further, each of the strobe line driver circuits may sequentially provide strobe signals to different memory die. The multiplexer may also be controlled by the interface control circuit 222 so that any of the individual strobe line driver circuits provide a strobe signal to any of the 2N strobe lines. The interface control circuit 222 may also provide strobe signals to multiple memory die in parallel to account for timing differences between the commands and the individual memory die. However, the interface control circuit 222 may need to stagger and sequence the strobe signals to avoid any collisions or empty spots on the common busses.

The programmability of the individual strobe line driver circuits may be used to account for different characteristics of the individual memory die A-N and to further allow each of the individual strobe line driver circuits to provide strobe signals to any of the memory die A-N without limitation. For example, each of the memory die A-N may have varying delays associated with different commands, such as read, write, and refresh commands. The differences in delays may be due to variations in process, temperature and voltage characteristics of the various memory die along with a distance from the interface control circuit and the external connections of the common busses. These delays may account for timing differences so that when a read command comes in for memory die B, for example, a delay in a strobe line driver circuit used to provide the strobe signal to the memory die B may be programmed to effectuate the read command. The delays associated with each memory die A-N corresponding to each type of command may be determined in a training operation. For example, delays relating for each command type (e.g., read, write, refresh, etc. may be determined for each of the memory die A-N. The delays determined for each command and memory die combination during the training operation may then be stored for later access, in a look up table for example. The training operation, as one skilled in the art would understand, may be run at system start up or at other times when the system needs to be reset. The programmable delays may then be programmed based on the delays stored in the look up table.

Figure 3:
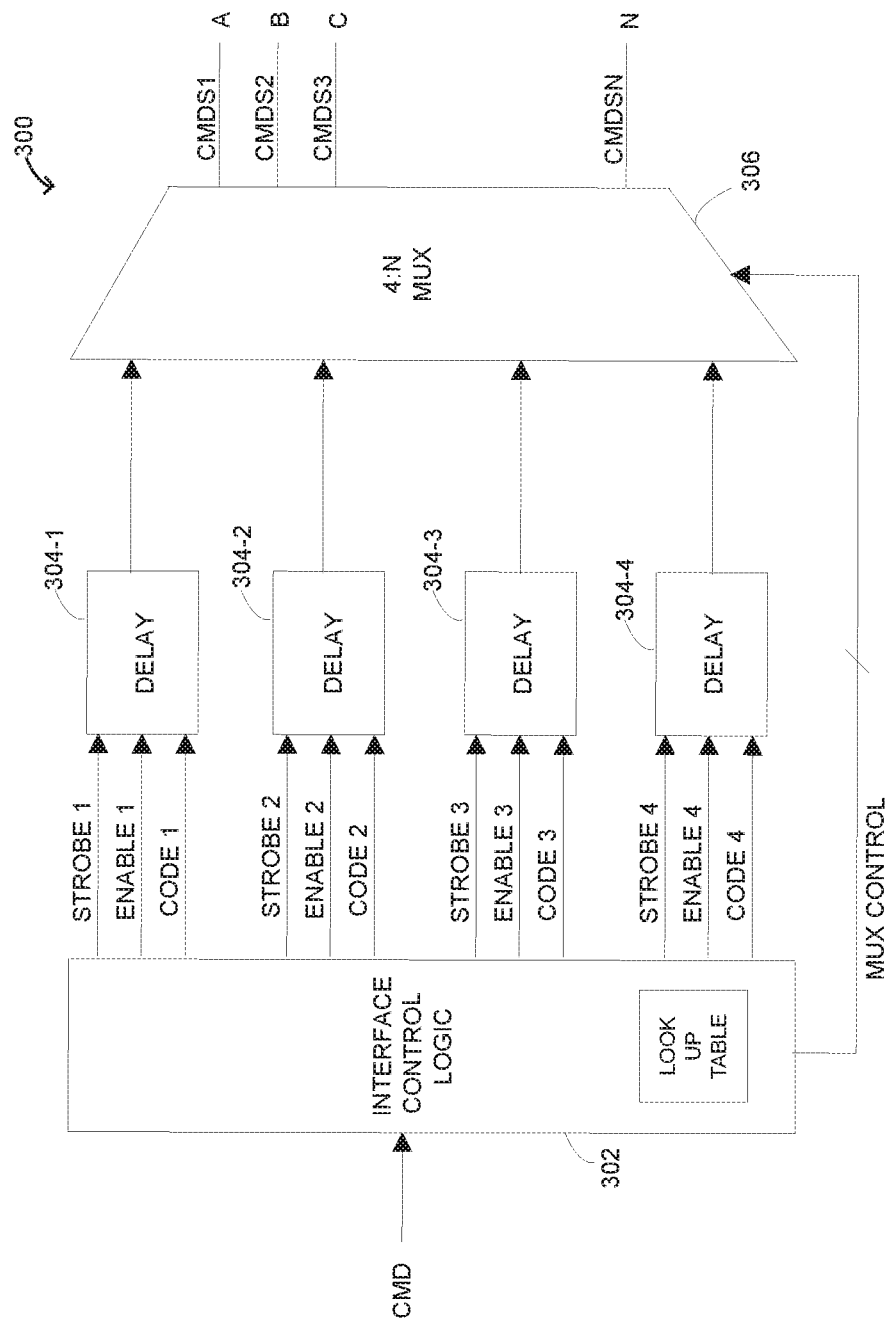
FIG. 3 is a block diagram of an example interface controller according to the present disclosure.

FIG. 3 is an example interface control circuit 300 according to an embodiment of the invention. The interface control circuit 300 may be used as the interface control circuit 200, 220 or 102 and may be implemented in the apparatus 100. The interface control circuit 300 may be configured to provide strobe signals to a plurality of memory die using a number of strobe line driver circuits multiplexed onto a larger number of dedicated strobe lines to strobe a plurality of memory die. The interface control circuit 300 may include interface control logic 302, a plurality of delays 304 and an X:N multiplexer (MUX) 306. Four delays 304 are shown in FIG. 3, but the present disclosure is not limited to four delays and any number of delays may fall within the scope of this disclosure. The ratio of the MUX 306 may depend on the number of strobe line driver circuits and the number of dedicated strobe lines. Hence, the MUX 306 may be a 4:N MUX since there are four delays 304 included in FIG. 3 and N dedicated strobe lines.

The MUX 306 may receive inputs from the delays 304 and may provide outputs to a plurality of dedicated strobe lines, N in the example shown in FIG. 3. Each of the plurality of dedicated strobe lines may be coupled to a respective one of a plurality of memory die, such as the plurality of memory die of FIGS. 2A and 2B, and may provide a strobe signal to cause the respective memory die to perform some command, such as a read command, a write command, or a refresh command. The number of dedicated strobe lines coupled to each of the plurality of memory die may vary based on their individual design. For example, a memory die may be coupled to two strobe lines with one of the strobe lines signaling a read or write command and the other strobe line signaling a refresh command. Variations on the number of strobe lines and their use would be known to one skilled in the art. Individual ones of the plurality of memory die may be coupled to a different number of dedicated strobe lines. For example, one memory die may be coupled to two strobe lines while another memory die may be coupled to three dedicated strobe lines.

The interface control logic 302 may receive commands, from a memory controller for example, and may determine which of a plurality of memory die to provide an active strobe signal so that the intended memory die captures the command. Each of the plurality of memory die (not shown) may be coupled to a common data and/or command bus (not shown). The command received by the interface control logic 302 may also be present on the common bus and may be captured by any of the plurality of memory die coupled to the common bus.

The interface control logic 302 may be coupled to the plurality of delays 304 and may provide various control signals to the delays 304. The controls signals provided by the interface control logic 302 may at least include a strobe signal, an enable signal, and a code signal. The enable signal may enable the delay 304, the code signal may program the delay 304 to provide an amount of delay associated with one of the plurality of memory die and further based on the type of command, e.g., a command/memory die combination. The enable signal may be a clock signal. The delay 304 delays the respective strobe signal by the programmed amount of delay. The delays programmed into the delay 304 by the interface control logic 302 may be determined by a training operation, as discussed above. The delays determined by the training operation may be stored in a look up table, for example, which may be accessed by the interface control logic 302 to determine a delay associated with a particular command/memory die combination (e.g., read command for memory die The control logic interface 302 may also control the MUX 306, A MUX control signal may be provided to the MUX 306 by the interface control logic 302 so that a strobe signal generated by one of the delays 304 may be coupled to the appropriate strobe line at the appropriate time.

Each of the plurality of delays 304 may be programmable to allow for changes in the amount of delay added to a strobe signal for a specific command/memory die combination. The programmability of the delays may allow each of the plurality of delays 304 to provide strobe signals to any of the plurality of memory die and in any sequence of memory die as well. Since each of the plurality of memory die may have a different delay associated with a specific command, each of the plurality of delays 304 may be programmed to provide a strobe signal to any of the plurality of memory die A-N for any type of command being executed. The programmability of the plurality of delays 304 may give flexibility to the interface control logic 302 when selecting a strobe line driver circuit for providing a strobe signal to a particular memory die because any of the delays 304 may be able to provide any strobe signal to any of the memory die A-N. Moreover, since multiple memory die may not access the common bus simultaneously, the number of strobe signals provided in parallel may be relatively low. Thus, the number of strobe signals provided to the plurality of memory die at any select time may be limited. As such, the number of strobe line driver circuits, and consequently the number of delays, that may be needed by the interface control circuit 300 may be less than the total number of dedicated strobe lines. Hence, fewer strobe line driver circuits than dedicated strobe lines may be used to provide the active strobe signals, for example, to maximize the common bus efficiency without each strobe line having a dedicated strobe line driver circuit.

Figure 4:
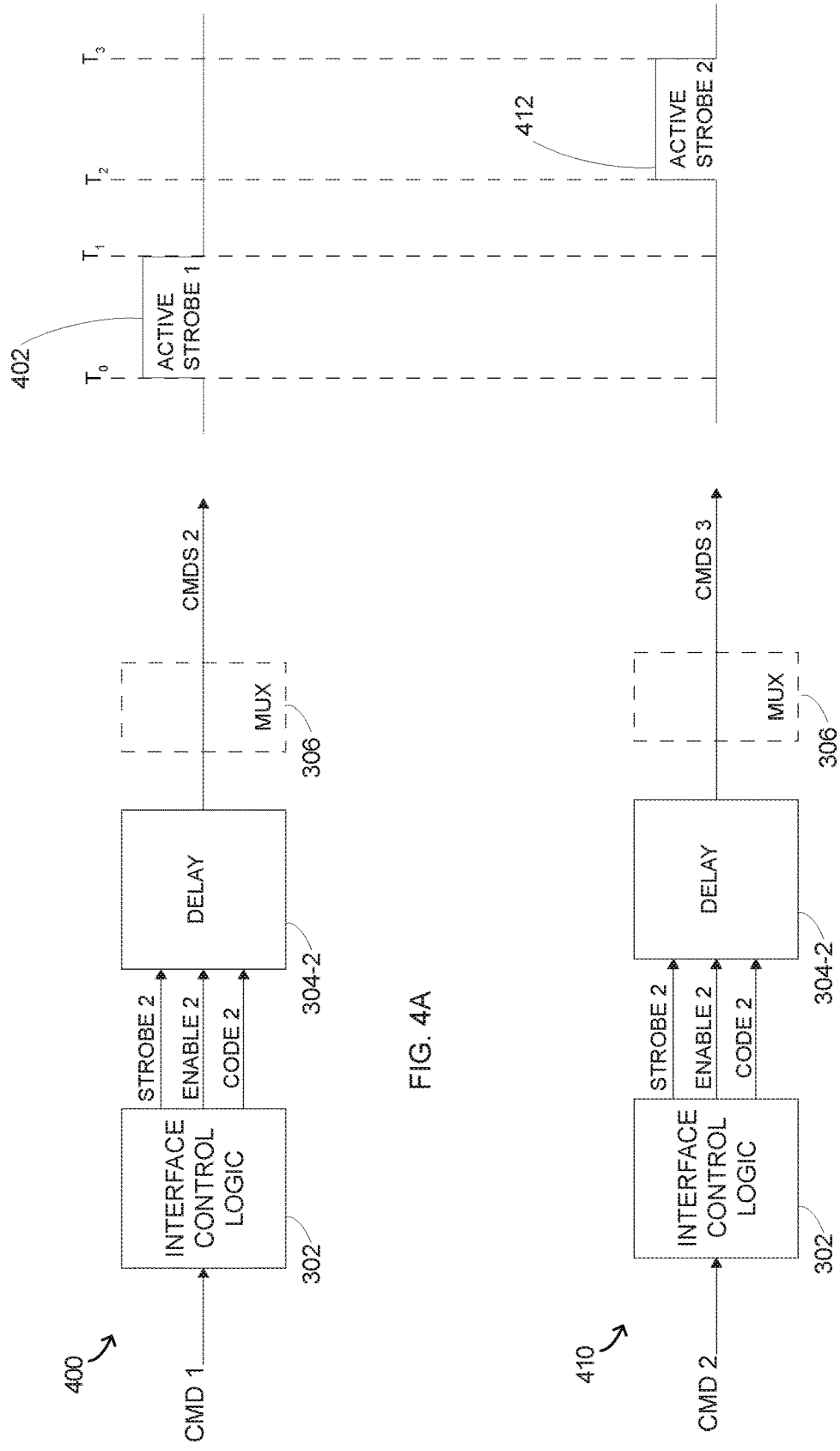
FIGS. 4A and 4B are block diagrams of an example interface controller according to the present disclosure.

FIGS. 4A and 4B are illustrative block diagrams of an interface control circuit in accordance with an embodiment of the invention. The illustrative block diagrams 400 and 410 of FIGS. 4A and 4B, respectively, are illustrating the interface control circuit 300 of FIG. 3 in operation. For ease of explanation, the same numbering has been used for like components as in FIG. 3 and descriptions of those components are omitted for brevity. The interface control circuit 400 depicts the interface control circuit 300 providing an active strobe signal 1 at time T0. To provide the active strobe signal 1, the interface control logic utilizes the delay 304-2 and couples the output of the delay 304-2 via the MUX 306 to the dedicated strobe line CMDS2, which may be coupled to a memory die B for example. While the active strobe signal 1 is propagating through the delay 304-2 and the CMDS2 strobe line, the control logic 302 may be initiating active strobe signals for other memory die using any of the other delays 304 of FIG. 3. However, at some point in time the control logic 302 may again use the delay 304-2 to provide an active strobe signal 2, for example, to a same or different strobe line than previous. For example, the control logic may program the delay 304-2 to provide a strobe signal for a different memory die, memory die D for example, which may use a different dedicated strobe line. The control logic 302 may then provide the active strobe signal 2 at time T2 from the delay 304-2 via the MUX 306 to the strobe line CMDS3.

Figure 5:
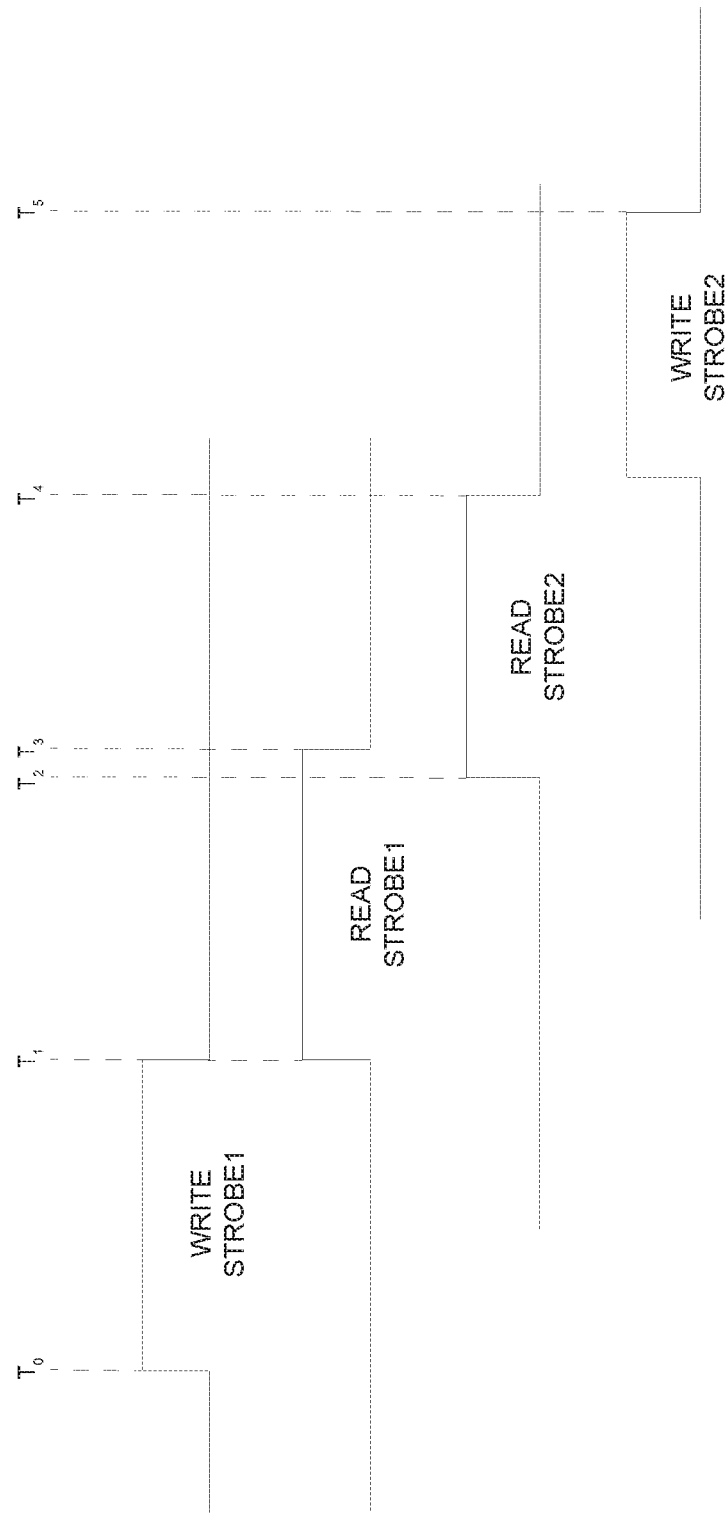
FIG. 5 is a timing diagram of various strobe signals provided by an interface controller example.

The operation of the interface control circuit 300 of FIG. 3 will now be described with reference to FIG. 5. FIG. 5 is an example timing diagram of strobe signals provided by the interface control circuit 300 in accordance with an embodiment of the invention. FIG. 5 shows an example sequence of four strobe signals provided by an interface control circuit, such as the interface control circuit 300 of FIG. 3, to four memory die of a plurality of memory die. The sequence of the four signals, which is not limiting to the present disclosure, includes, in order, a write strobe 1, a read strobe 1, a read strobe 2, and a write strobe 2. As illustrated in FIG. 5 the read strobe 1 and the read strobe 2 partially overlap. That is, the read strobe 1 and the read strobe 2 signals are both concurrently active (e.g., active high) between time T2 when the read strobe 2 signal becomes active and time T3 when the read strobe 1 signal becomes inactive. The alignment or overlapping between successive strobe signals may be a result of the latency of the respective commands. The four strobe signals may be provided responsive to commands received by a memory device, such as the apparatus 100 of FIG. 1. The order the commands are received by the memory device may be the order in which the strobes are transmitted or the strobes may be transmitted in an alternate order. For example, the first and second write commands may be received before the first and second read commands, but the interface control circuit may decide to process them in a slightly different order as shown in FIG. 5. Additionally, the memory device may be operating based on a core clock (not shown), which may affect the amount of overlap, if any, of two consecutive strobe signals.

The write strobe 1 may be provided by the delay 304-1 of FIG. 3 and may be intended for one of the plurality of memory die, such as memory die B. Before providing the write strobe 1, the interface control logic 302 may enable the delay 304-1 by providing a clock signal and a code to program the delay 304-1 to the correct delay. The interface control logic 302 may consult an included look up table that lists the various delays associated with every memory die and command type combination. Once the delay 304-1 is programmed and enabled, the interface control logic 302 may provide an active strobe signal to the delay 304-1. Before the write strobe 1 signal arrives at the MUX 306, the interface control logic 302 may provide a control signal to the MUX 306 to connect the output from the delay 304-1 to the strobe line for memory die B, such as the line labeled CMDS2 in FIG. 3. As the strobe signal propagates through the delay 304-1 and the MUX 306, the interface control logic 302 may begin the initiation process for another one of the plurality of delays, such as the delay 304-2, to provide a subsequent active strobe signal, such as the read strobe 1. The same sequence of initiation events may occur for each active strobe signal provided by the interface control logic 302, but their relative timing may change based on the sequence of commands being received and initiated.

Each strobe signal provided by the interface control logic 302 may be active (e.g., at a high logic level) for different periods of time. The variance in active times for the respective active strobe signals may depend on the type of command (e.g., read or write) and the intended memory die. The active period may further be determined by a window of time the command and/or data is on the common bus and available for the intended memory die. When a strobe signal becomes active, such as write strobe 1 at time T0, the receiving memory die may access the common bus to capture the command and/or data then present on the common bus. Conversely, when an active strobe signal is inactive (e.g., a low logic level) the memory die receiving the active strobe may not access the common bus. For example, at time T1, the active write strobe 1 becomes inactive, which may cause the memory die receiving write strobe 1 to release the common bus. Further, during the time period between T0 and T1, the memory die receiving the active write strobe 1 signal may be the only memory die of the plurality of memory die accessing the common bus. A subsequent active strobe signal for another die (e.g., the read strobe 1), however, may cause that intended memory die to be active and to access the common bus so that the new command is captured by the intended memory die. As such, the active strobe signals may determine which of the plurality of memory die accesses the common bus and only the memory die receiving the active strobe may access the common bus while the strobe signal is active.

As previously described, FIG. 5 shows that read strobe 1 and read strobe 2 overlap (e.g., between time T2 and T3), which may correspond to a number of clock cycles of the core clock, two clock cycles for example. That is, read strobe 2 becomes active at time 12, which may be two dock cycles before read strobe 1 becomes inactive at time T3. The potential for overlap and the amount of overlap may be based on the sequence of the strobe signals and how long the associated commands take to process by the receiving memory die, e.g., based on their associated latency. The interface control logic 302 may program the delays 304 based on the length of time the various memory die take to process or ready their circuits to process commands, and as a result, the strobe signals provided by the interface control logic 302 may overlap in certain instances. For example, the interface control logic 302 may take into account that a read command takes a memory die x amount of clock cycles (of the core clock) to prepare for capturing read data, and that x amount of clocks may allow the interface control logic 302 to begin one strobe before the previous strobe ends, such as providing active read strobe 2 before read strobe 1 becomes inactive. This ability to overlap strobe signals and transmit multiple strobe signals in substantially parallel fashion may allow the interface control circuit to maximize the common bus efficiency by minimizing the amount of time the common bus is not carrying information.

Further, multiple of the active strobes depicted in FIG. 5 may be provided by the same delay, such as the delay 304-3 of FIG. 3. The programmability of each of the delays 304 of FIG. 3 may allow them to provide active strobe signals to multiple intended memory die. For example, the interface control logic 302 may enable and program the delay 304-2 to provide the active write strobe 1 at time T0. Then, while active read strobe 1 and/or active read strobe 2 are being provided to their intended memory die, the interface logic controller 302 may enable and program the delay 304-2 to provide the active write strobe signal 2. The active read strobe 1 and the active read strobe 2 may be provided by other individual delays 304.

From the foregoing it will be appreciated that, although specific embodiments of the invention have been described herein for purposes of illustration, various modifications may be made without deviating from the spirit and scope of the invention. For example, FIG. 3 illustrates an embodiment including four delays 304. However, in other embodiments, greater or fewer delays may be included. Accordingly, the invention is not limited to the specific embodiments of the invention described herein.

What is claimed is:

1. An apparatus comprising:
   a first memory die;
   a first bus;
   a common bus; and
   an interface control logic stacked with the first memory die and coupled to the first memory die through the first bus and the common bus, the interface control logic including:
      a plurality of delay circuits configured to output a plurality of strobe signals having different amounts of delay from one another; and
      a multiplexer configured to select a first one of the plurality of strobe signals, responsive to a first command, based on a type of the first command and a first latency of the first memory die, transferred through the common bus and output the first one of the plurality of strobe signals to the first bus;
   wherein the first memory die is configured to capture the first command responsive to the first one of the plurality of strobe signals.

2. The apparatus of claim 1, wherein each of the plurality of delay circuits is a variable delay circuit and an amount of delay of each of the plurality of delay circuits is set in a training operation.

3. The apparatus of claim 1, wherein the multiplexer is further configured to select a second one of the plurality of strobe signals, responsive to a second command, based on a type of the second command and the first latency of the first memory die, transferred through the common bus and output the second one of the plurality of strobe signals to the first bus, wherein the second command indicates a different operation from the first command; and
   wherein the first memory die is further configured to capture the second command responsive to the second one of the plurality of strobe signals.

4. The apparatus of claim 3, the first one of the plurality of strobe signals and the second one of the plurality of strobe signals are different in activated period of time from each other.

5. The apparatus of claim 4, wherein the type of the first command is one of read and write commands, and wherein the type of the second command is the other of read and write commands.

6. The apparatus of claim 1, further comprising:
   a second memory die stacked with the first memory die, wherein the first memory die is stacked between the interface control logic and the second memory die; and
   a second bus electrically independent of the first memory bus;
   wherein the interface control logic is coupled to the second memory die through the second bus and the common bus and the multiplexer of the interface control logic is further configured to select a second one of the plurality of strobe signals, responsive to a second command, based on a type of the second command and a second latency of the second memory die, transferred through the common bus and output the second one of the plurality of strobe signals to the second bus; and
   wherein the second memory die is configured to capture the second command responsive to the second strobe signal.

7. The apparatus of claim 6, the first one of the plurality of strobe signals and the second one of the plurality of strobe signals are different in activated period of time from each other.

8. The apparatus of claim 7, wherein the first command is a read command and the second command is a write command.

9. The apparatus of claim 7, each of the first command and the second command is one of read and write commands.

10. An apparatus comprising:
    an interface control logic;
    a first memory die;
    a second memory die;
    a common bus coupled in common to the interface control logic, the first memo die and the second memory die;
    a first bus coupled between the interface control logic and the first memory die and decoupled from the second memory die; and
    a second bus coupled between the interface control logic and the second memory die and decoupled from the first memory die;
    wherein the interface control logic, the first memory die and the second memory die are stacked on one another;
    wherein the interface control logic is configured to transfer a first command, based on a first latency of the first memory die, through the common bus with providing a first strobe signal to the first bus, and wherein the interface control logic is further configured to transfer a second command, based on a second latency of the second memory die, through the common bus with providing a second strobe signal to the second bus; and
    wherein the first memory die is configured to capture the first command responsive to the first strobe signal and the second memory die is configured to capture the second command responsive to the second strobe signal.

11. The apparatus of claim 10, wherein the first strobe signal and the second strobe signal are different in activated period of time from each other.

12. The apparatus of claim 11, wherein the type of the first command is one of read and write commands, and wherein the type of the second command is the other of read and write commands.

13. The apparatus of claim 11, wherein each of the first command and the second command is one of read and write commands.

14. The apparatus of claim 10, wherein a part of an activated period of time of the first strobe signal overlaps a part of an activated period of time of the second strobe signal.

15. The apparatus of claim 10, wherein the interface control logic includes: a plurality of delay circuits configured to output a plurality of strobe signals having different amounts of delay from one another; and
    a multiplexer configured to select a first one of the plurality of strobe signals as the first strobe signal responsive to the first command and select a second one of the plurality of strobe signals as the second strobe signal.

16. The apparatus of claim 15, wherein each of the plurality of delay circuits is a variable delay circuit and an amount of delay of each of the plurality of delay circuits is set in a training operation.

17. The apparatus of claim 15, wherein the first command is one of read and write commands and the second command is the other of read and write commands.

18. The apparatus of claim 15, wherein each of the first command and the second command is one of read and write commands.

* * * * *